United States Patent
Hung et al.

(10) Patent No.: US 9,196,352 B2
(45) Date of Patent: Nov. 24, 2015

(54) STATIC RANDOM ACCESS MEMORY UNIT CELL STRUCTURE AND STATIC RANDOM ACCESS MEMORY UNIT CELL LAYOUT STRUCTURE

(71) Applicant: UNITED MICROELECTRONICS CORP., Hsin-Chu (TW)

(72) Inventors: Ching-Wen Hung, Tainan (TW); Po-Chao Tsao, New Taipei (TW); Shu-Ru Wang, Taichung (TW); Chia-Wei Huang, Kaohsiung (TW); Chieh-Te Chen, Kaohsiung (TW); Feng-Yi Chang, Tainan (TW); Chih-Sen Huang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 287 days.

(21) Appl. No.: 13/776,589

(22) Filed: Feb. 25, 2013

(65) Prior Publication Data
US 2014/0241027 A1    Aug. 28, 2014

(51) Int. Cl.
| H01L 21/70  | (2006.01) |
| G11C 11/00  | (2006.01) |
| G11C 11/412 | (2006.01) |
| H01L 27/02  | (2006.01) |
| H01L 27/11  | (2006.01) |

(52) U.S. Cl.
CPC .......... *G11C 11/412* (2013.01); *H01L 27/0207* (2013.01); *H01L 27/1104* (2013.01)

(58) Field of Classification Search
CPC .................................................... G11C 11/412
See application file for complete search history.

(56) References Cited

U.S. PATENT DOCUMENTS

| 6,855,607 | B2  |    | 2/2005  | Achuthan |
|-----------|-----|----|---------|----------|
| 7,013,446 | B2  |    | 3/2006  | Ohba |
| 7,112,495 | B2  |    | 9/2006  | Ko |
| 7,250,658 | B2  |    | 7/2007  | Doris |
| 7,521,324 | B2  |    | 4/2009  | Ohmi |
| 7,531,437 | B2  |    | 5/2009  | Brask |
| 7,592,270 | B2  |    | 9/2009  | Teo |
| 7,643,331 | B2  | *  | 1/2010  | Inaba ............................ 365/154 |
| 2003/0127752 | A1 | * | 7/2003 | Kim et al. ............. 257/E27.098 |
| 2007/0015365 | A1 |   | 1/2007 | Chen |
| 2007/0072376 | A1 |   | 3/2007 | Chen |
| 2007/0218661 | A1 |   | 9/2007 | Shroff |
| 2008/0061366 | A1 |   | 3/2008 | Liu |
| 2009/0057759 | A1 |   | 3/2009 | Obradovic |
| 2009/0059640 | A1 | * | 3/2009 | Funane et al. .................. 365/51 |
| 2009/0124097 | A1 |   | 5/2009 | Cheng |
| 2009/0200494 | A1 |   | 8/2009 | Hatem |
| 2010/0044783 | A1 |   | 2/2010 | Chuang |
| 2010/0048027 | A1 |   | 2/2010 | Cheng |
| 2010/0129994 | A1 |   | 5/2010 | Awad |
| 2013/0272056 | A1 | * | 10/2013 | Liaw ............................. 365/154 |

OTHER PUBLICATIONS

Yang, U.S. Appl. No. 13/338,353, filed Dec. 28, 2011.

* cited by examiner

*Primary Examiner* — Long K Tran
(74) *Attorney, Agent, or Firm* — Winston Hsu; Scott Margo (57) ABSTRACT

A static random access memory unit cell layout structure is disclosed, in which a slot contact is disposed on one active area and another one across from the one. A static random access memory unit cell structure and a method of fabricating the same are also disclosed, in which, a slot contact is disposed on drains of a pull-up transistor and a pull-down transistor, and a metal-zero interconnect is disposed on the slot contact and a gate line of another pull-up transistor. Accordingly, there is not an intersection of vertical and horizontal metal-zero interconnects, and there is no place suffering from twice etching. Leakage junction due to stitch recess can be avoided.

18 Claims, 8 Drawing Sheets

STATIC RANDOM ACCESS MEMORY UNIT CELL STRUCTURE AND STATIC RANDOM ACCESS MEMORY UNIT CELL LAYOUT STRUCTURE

BACKGROUND OF THE INVENTION

1. Field of the Invention

The present invention relates to a memory structure, and particularly to a static random access memory unit cell structure (SRAM unit cell structure) and layout structure.

2. Description of the Prior Art

A static random access memory (SRAM) comprises a logic circuit and a static random access memory connected to the logic circuit. In a conventional memory unit cell structure manufacturing process, due to limitations in the lithography process, for forming metal-zero interconnects, which lengthwise direction may be referred to as a vertical direction, located on contacts and metal-zero interconnects, which lengthwise direction may be referred to as a horizontal direction, located on pairs of a contact and a gate line, twice microlithography and etching processes are required to respectively form trenches, subsequently the trenches are filled with metal, and then a chemical mechanical polishing (CMP) process is performed. In other words, in the processes, one microlithography and etch process is performed to form trenches arranged in a vertical direction, and another microlithography and etch process is performed to form trenches arranged in a horizontal direction. The intersection of the vertical and the horizontal trenches for forming metal-zero interconnects is the place subject to twice etching processes, such that a local erosion occurs in the deep of the substrate, and it may be referred to as "stitch". In a worsen situation, such erosive stitch recess reaches diffusion regions to cause junction leakage, resulting in low yield. Such damage to the substrate is more serious in the SiGe technology.

Therefore, there is still a need for a novel SRAM unit cell structure to avoid the junction leakage.

SUMMARY OF THE INVENTION

One objective of the present invention is to provide an SRAM unit cell structure and layout structure, and accordingly the problems as aforesaid can be solved.

According to an embodiment, a static random access memory (SRAM) unit cell layout structure is provided. The SRAM unit cell layout structure includes a semiconductor substrate, a first gate line, and a first slot contact. The semiconductor substrate includes a first active area and a second active area parallel to the first active area. The first gate line passes through a surface of the first active area and a surface of the second active area. The first slot contact is disposed on the first active area and the second active area both on a same side of the first gate line. Herein, the term "slot" means slot-shaped or long-and-narrow-shaped.

According to another embodiment, an SRAM unit cell structure is provided. The SRAM unit cell structure includes a first inverter, a second inverter, a first slot contact, a second slot contact, a first metal-zero interconnect, and a second metal-zero interconnect. The first inverter includes a first pull-down transistor and a first pull-up transistor. The second inverter includes a second pull-down transistor and a second pull-up transistor. The first slot contact is disposed on a drain of the first pull-down transistor and a drain of the first pull-up transistor. The first metal-zero interconnect is disposed on the first slot contact and a gate line of the second pull-up transistor. The second slot contact is disposed on a drain of the second pull-down transistor and a drain of the second pull-up transistor. The second metal-zero interconnect is disposed on the second slot contact and a gate line of the first pull-up transistor.

Herein, the term "metal-zero interconnect" means a metal interconnect made of a metal level zero (M0) located in an interlayer dielectric (ILD), and it will be described in detail hereinafter.

Because, in the structure of the SRAM unit cell structure, there is no intersection of vertical and horizontal metal-zero interconnects, no place of the substrate will suffer from erosion by twice etching processes. Therefore, junction leakage due to deep stitch as mentioned above can be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
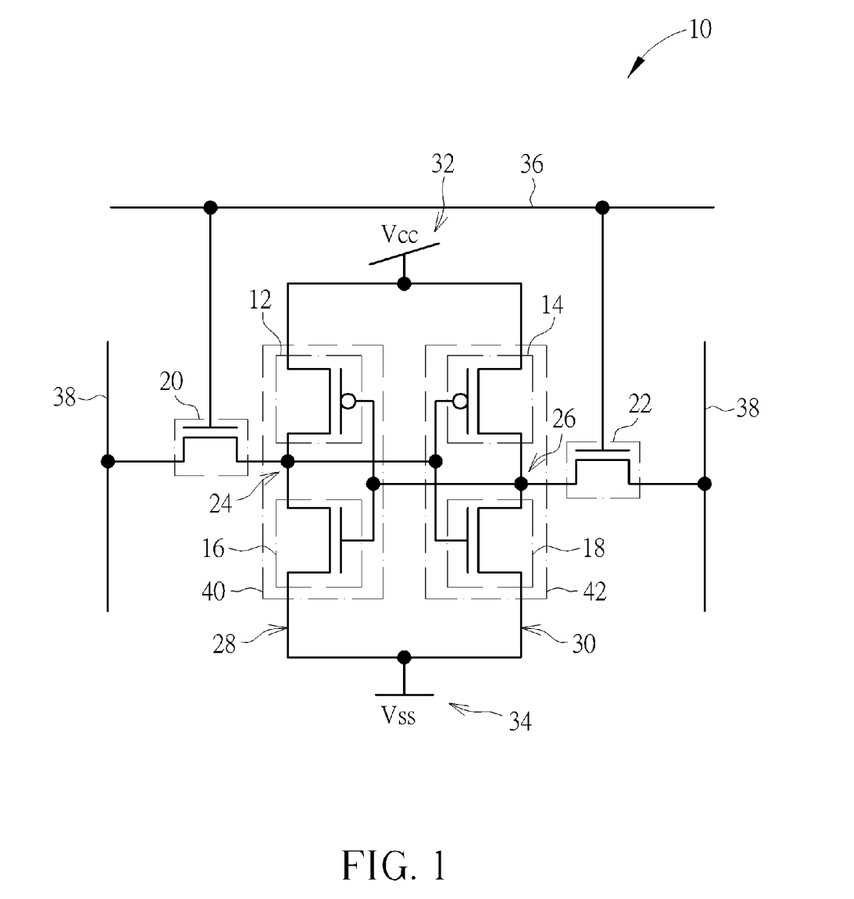
FIG. 1 is a circuit diagram illustrating an SRAM unit cell according to an embodiment of the present invention.

Please refer to FIG. 1, which shows a circuit diagram of an SRAM unit cell according to an embodiment of the present invention and is mainly presented by transistors. The SRAM unit cell 10 is a six-transistor SRAM (6T-SRAM) and comprises first and second pull-up transistors 12 and 14, first and second pull-down transistors 16 and 18, and access transistors 20 and 22. The first and second pull-up transistors 12, 14 and the first and second pull-down transistors 16, 18 constitute a latch that stores data in the storage node 24 or 26. The gates of the access transistors may be also referred to as passing gates.

Generally speaking, the first and second pull-up transistors 12, 14 of the 6T-SRAM cell 10 comprise p-type field effect transistors (pFETs), such as PMOS FETs. The pull-down transistors 16, 18 and the access transistors 20, 22 comprise n-type field effect transistors (nFETs), such as NMOS FETs. The first pull-up transistor 12 and the first pull-down transistor 16 constitute a first inverter 40, and a series circuit 28. One end of the series circuit 28 is connected to a power supply ($V_{CC}$) 32 and the other end of the series circuit 28 is connected to a ground ($V_{SS}$) 34. Likewise, the second pull-up transistor 14 and the second pull-down transistor 18 constitute another inverter and a series circuit 30. One end of the series circuit 30 is connected to the power supply 32 and the other end of the series circuit 30 is connected to the ground 34.

Additionally, the storage node 24 is connected to the respective gates of the second pull-down transistor 18 and the second pull-up transistor 14. The storage node 24 is also connected to the drains of the first pull-down transistor 16, the first pull-up transistor 12 and the access transistor 20. Likewise, the storage node 26 is connected to the respective gates of the first pull-down transistor 16 and the first pull-up transistor 12. The storage node 26 is also connected to the drains of the second pull-down transistor 18, the second pull-up transistor 14 and the access transistor 22. The gates of the access transistors 20 and 22 are respectively coupled to a word line 36, and the sources are coupled to a relative data line 38.

Figure 2:
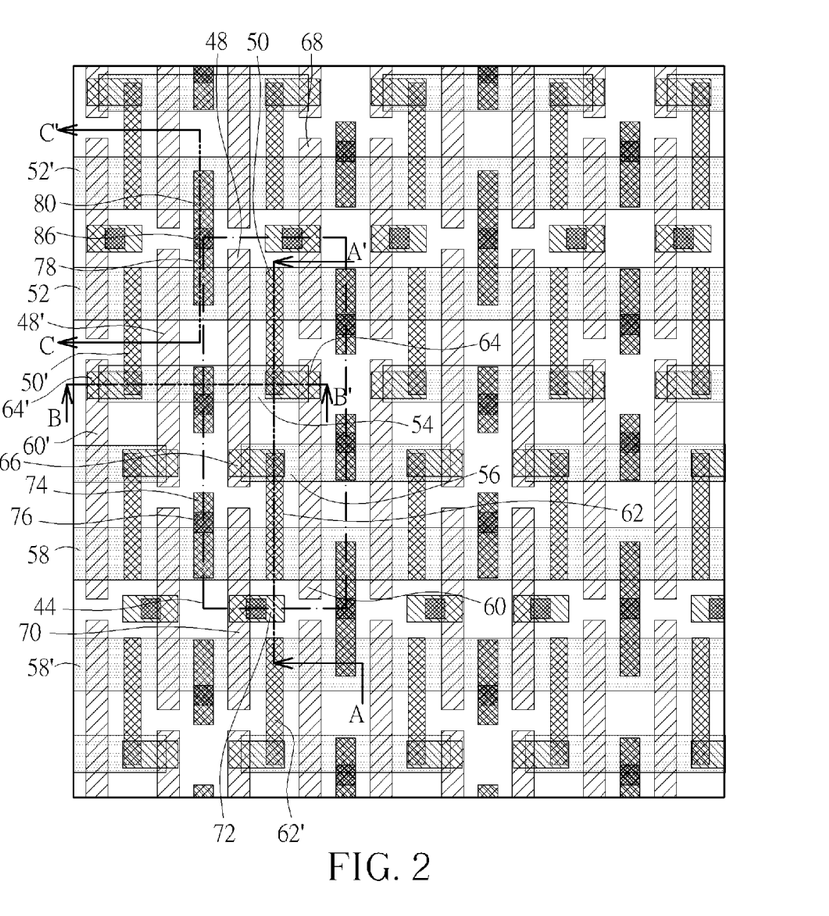
FIG. 2 is a schematic diagram illustrating an SRAM unit cell layout structure according to an embodiment of the present invention.
Figure 3:
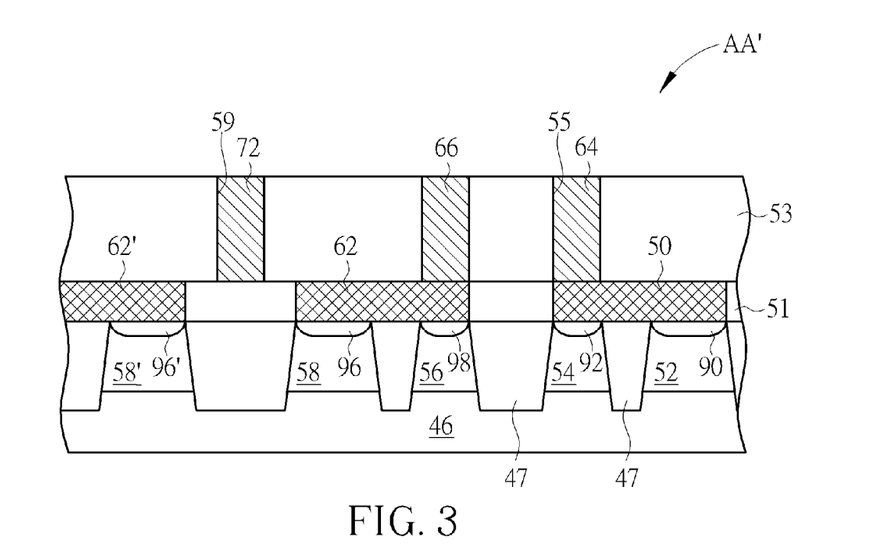
FIGS. 3, 4, and 5 are schematic cross-sectional views taken along lines AA', BB', and CC' shown in FIG. 2, respectively.
Figure 4:
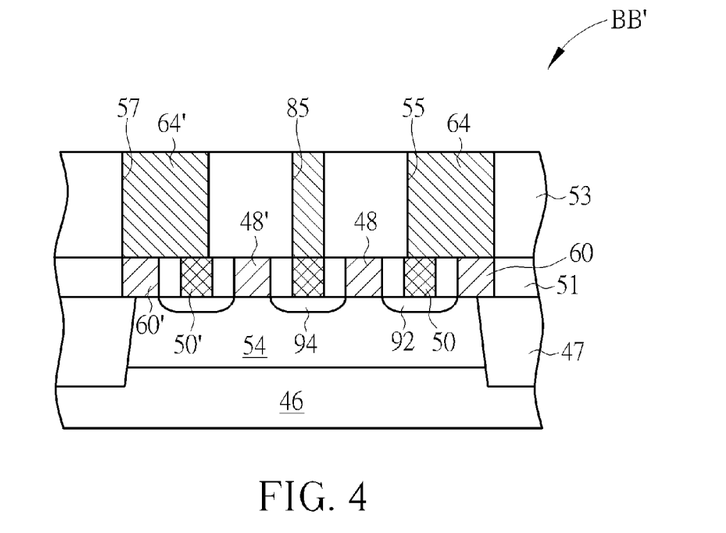
Figure 5:
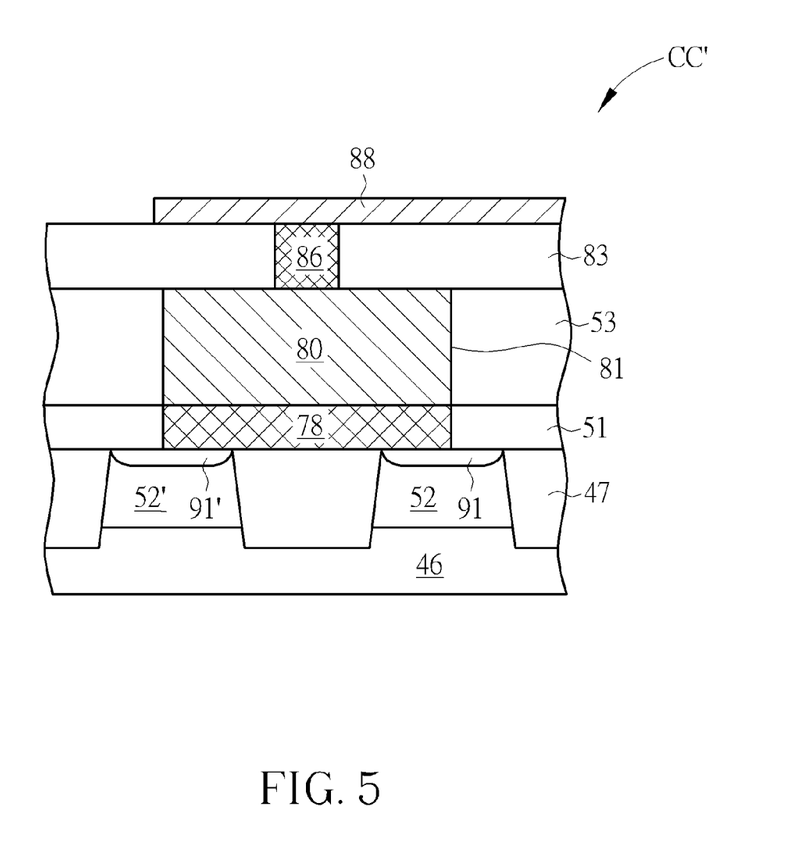

FIG. 2 is a schematic diagram showing an SRAM unit cell layout structure according to an embodiment of the present invention, which may be based on the circuit diagram as shown in FIG. 1. FIGS. 3, 4, and 5 are schematic cross-sectional views taken along lines AA', BB', and CC' shown in FIG. 2, respectively, to further illustrate the SRAM unit cell structure.

Referring to FIGS. 1-5, an SRAM unit cell layout structure according to an embodiment of the present invention is described as follows. An SRAM unit cell layout structure 44 includes a semiconductor substrate 46, a first gate line 48, and a first slot contact 50. The semiconductor substrate 46 includes a first active area 52 and a second active area 54 parallel to the first active area 52. The first gate line 48 passes through a surface of the first active area 52 and a surface of the second active area 54. The first slot contact 50 is disposed on the first active area 52 and the second active area 54 both on a same side of the first gate line 48, as shown in FIGS. 2 and 3.

Accordingly, the first pull-down transistor 16 shown in FIG. 1 may include a gate formed of the first gate line 48 and a pair of a drain 90 and a source located in the first active area 52 on two sides of the gate; and the first pull-up transistor 12 may include a gate formed of the first gate line 48 and a pair of a drain 92 and a source 94 located in the second active area 54 on two sides of the gate. The first slot contact 50 serves for a node contact.

In the SRAM unit cell layout structure 44, the semiconductor substrate 46 further includes a third active area 56 and a fourth active area 58 parallel to the second active area 54. The second active area 54 is positioned between the first active area 52 and the third active area 56. The third active area 56 is positioned between the second active area 54 and the fourth active area 58. The SRAM unit cell layout structure 44 may further includes a second gate line 60 and a second slot contact 62. The second gate line 60 passes through a surface of the third active area 56 and through a surface of the fourth active area 58. The second slot contact 62 is disposed on the third active area 56 and the fourth active area 58 on the same side of the second gate line 60 and across an isolation structure 47, as shown in FIGS. 2 and 3. Each active area is electrically isolated by the isolation structure 47, such as a shallow trench isolation (STI).

Accordingly, the second pull-down transistor 18 as shown in FIG. 1 may include a gate formed of the second gate line 60 and a pair of a drain 96 and a source located in the fourth active area 58 on two sides of the gate; and the second pull-up transistor 14 may include a gate formed of the second gate line 60 and a pair of a drain 98 and a source located in the third active area 56 on two sides of the gate. The second slot contact 62 serves for a node contact.

The SRAM unit cell layout structure 44 may further include a first metal-zero interconnect 64 and a second metal-zero interconnect 66. The first metal-zero interconnect 64 is disposed on the first slot contact 50 and the second gate line 60, as shown in FIGS. 2 and 4. The second metal-zero interconnect 66 is disposed on the second slot contact 62 and the first gate line 48.

As shown in FIG. 2, the first slot contact 50 and the second slot contact 62 may be substantially arranged to be disposed along a straight line, for forming a compact structure.

The SRAM unit cell layout structure 44 may further include a third gate line 68 and a fourth gate line 70. The third gate line 68 passes through a surface of the first active area 52 on one side of the first gate line 48 to form the access transistor 20 as shown in FIG. 1. This side is the same side on which the first slot contact 50 is located. The first slot contact 50 is disposed between the first gate line 48 and the third gate line 68. The fourth gate line 70 passes through a surface of the fourth active area 58 on one side of the second gate line 60 to form the access transistor 22 as shown in FIG. 1. This side is the same side on which the second slot contact 62 is located. The second slot contact 62 is disposed between the second gate line 60 and the fourth gate line 70, as shown in FIG. 2.

The first slot contact 50 and the first metal-zero interconnect 64 form a local interconnect which electrically connects the gates of the second pull-down transistor 18 and the second pull-up transistor 14 and the drains of the first pull-down transistor 16, the first pull-up transistor 12, and the access transistor 20 to form the storage node 24. The second slot contact 62 and the second metal-zero interconnect 66 form a local interconnect which electrically connects the gates of the first pull-down transistor 16 and the first pull-up transistor 12 and the drains of the second pull-down transistor 18, the second pull-up transistor 14, and the access transistor 22 to form the storage node 26.

The SRAM unit cell layout structure 44 may further include a word line pad 72, which connects with the fourth gate line 70, as shown in FIG. 2. A via may be disposed on the word line pad 72 to be electrically connected to the word line 36.

The SRAM unit cell layout structure 44 may further include a bit line contact 74, which connects with the fourth active area 58 disposed on another side of the gate line 70. The SRAM unit cell layout structure 44 may further include a bit line pad 76 located on the bit line contact 74. A via may be disposed on the bit line pad 76 to be electrically connected to the bit line 38.

As shown in FIGS. 2 and 5, the SRAM unit cell layout structure 44 may further include a slot grounding electrode contact 78. The slot grounding electrode contact 78 is disposed on the first active area 52 on another side of the first gate line 48 and extends onto an active area 52' of an adjacent SRAM unit cell layout structure. A grounding electrode pad 80 is disposed on the slot grounding electrode contact 78. The grounding electrode pad 80 may be electrically connected to a power source, such as a ground 34. In this embodiment, since the slot grounding electrode contact 78 is relatively large, the operation window for the fabrication can be relatively wide.

Figure 6:
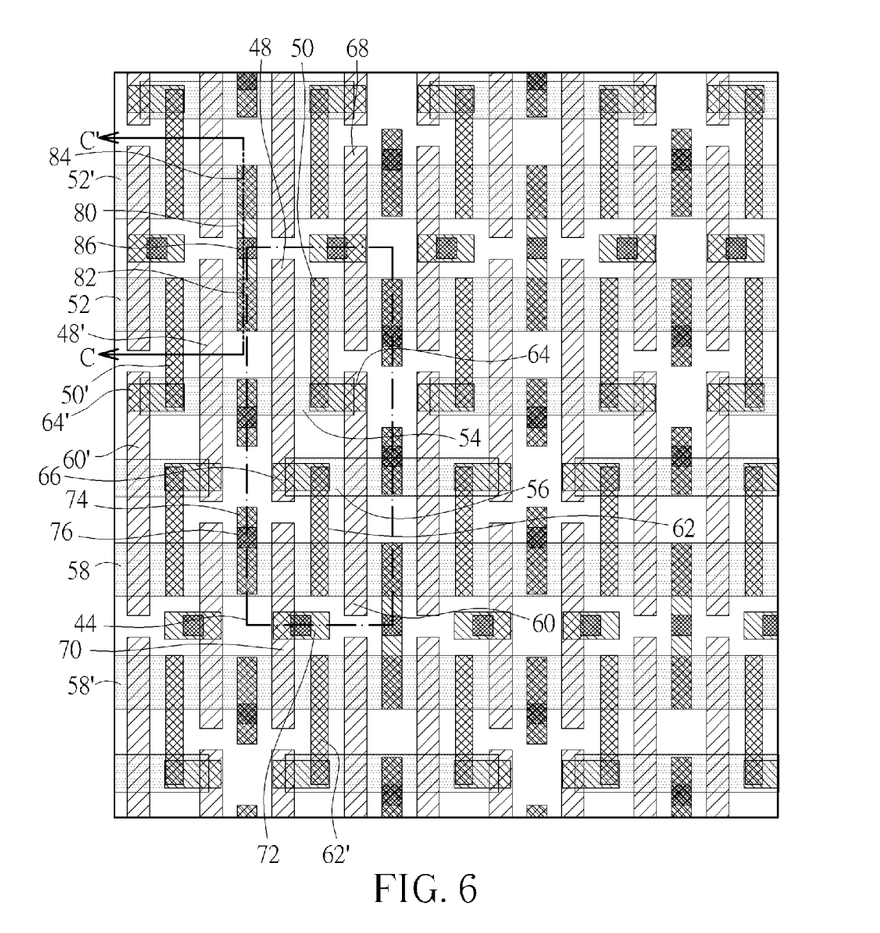
FIG. 6 is a schematic diagram illustrating an SRAM unit cell layout structure according to another embodiment of the present invention.
Figure 7:
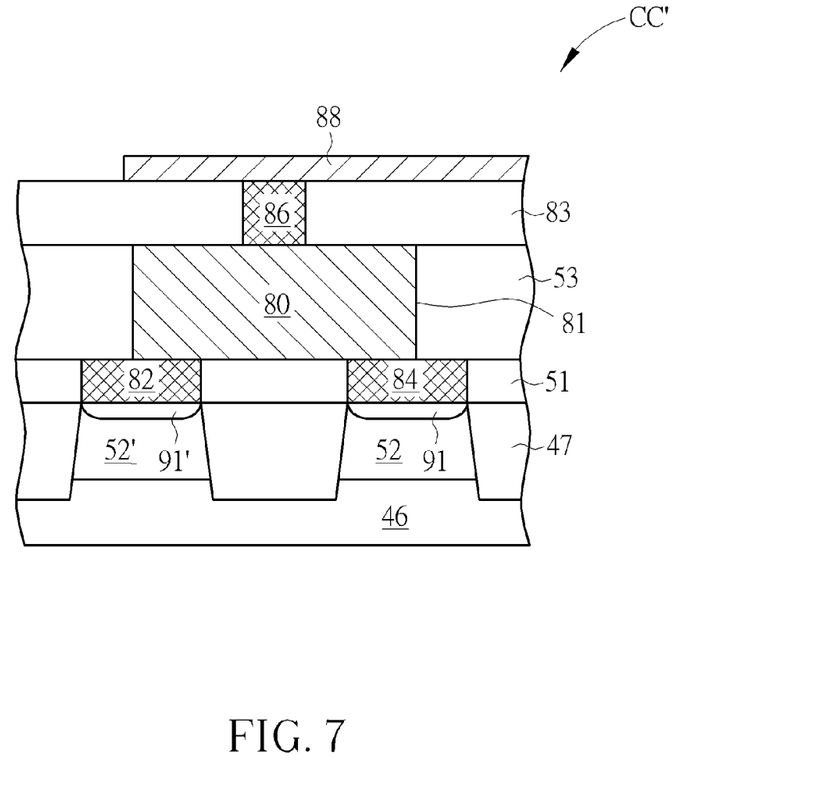
FIG. 7 is a schematic cross-sectional view taken along line CC' shown in FIG. 6.

FIGS. 2 and 5 illustrate a slot grounding electrode contact 78 which crosses an isolation structure 47 and extends to connect the first active area 52 (source 91) of one unit cell structure and an active area 52' (source 91') of another unit cell structure, but not limited thereto. FIGS. 6 and 7 illustrate a pair of split grounding electrode contacts 82 and 84. The split grounding electrode contacts 82 and 84 are disposed on the first active area 52 (source 91) on another side of the first gate line 48 and an active area 52' (source 91') of an adjacent SRAM unit cell layout structure, respectively. The grounding electrode pad 80 is disposed on the pair of split grounding electrode contacts 82 and 84 and crosses an interlayer dielectric-level one 51 between the split grounding electrode contacts 82 and 84.

The SRAM unit cell layout structure 44 may further include a via 86 disposed on the grounding electrode pad 80 and a metal-one interconnect 88 disposed on the via 86.

It is noticeable that, according to one embodiment of the present invention, a layout structure of an SRAM cell array may include a plurality of SRAM unit cell structure as the aforesaid, and one of any two adjacent unit cell structures is allowed to be a mirror image of another.

Also referring to FIGS. 1-5, an SRAM unit cell structure according to another embodiment of the present invention is described as follows. An SRAM unit cell structure includes the first inverter 40, the second inverter 42, the first slot contact 50, the second slot contact 62, the first metal-zero interconnect 64, and the second metal-zero interconnect 66. The first inverter 40 includes the first pull-down transistor 16 and the first pull-up transistor 12. For example, the first pull-down transistor 16 includes a gate formed of the first gate line 48 and a pair of a drain 90 and a source in the first active area 52 on two sides of the gate; and the first pull-up transistor 12 includes a gate formed of the first gate line 48 and a pair of a drain 92 and a source 94 in the second active area 54 on two sides of the gate, referring to FIG. 4 together. The second inverter 42 includes the second pull-down transistor 18 and the second pull-up transistor 14. For example, the second pull-down transistor 18 includes a gate formed of the second gate line 60 and a pair of a drain 96 and a source in the fourth active area 58 on two sides of the gate; and the second pull-up transistor 14 includes a gate formed of the second gate line 60 and a pair of a drain 98 and a source in the third active area 56 on two sides of the gate.

The first slot contact 50 is disposed on a drain 90 of the first pull-down transistor 16 and a drain 92 of the first pull-up transistor 12. The first metal-zero interconnect 64 is disposed on the first slot contact 50 and a gate line 60 of the second pull-up transistor. The second slot contact 62 is disposed on a drain 96 of the second pull-down transistor 18 and a drain 98 of the second pull-up transistor 14. The second metal-zero interconnect 66 is disposed on the second slot contact 62 and a gate line 48 of the first pull-up transistor 12.

The top surface of the first slot contact 50 is substantially as high as or slightly higher than the top surface of the second gate line 60 of the second pull-up transistor 14. Furthermore, the top surface of the second slot contact 62 is substantially as high as or slightly higher than the top surface of the first gate line 48 of the first pull-up transistor 12. Furthermore, the gate line of the first pull-down transistor 16 and the gate line of the first pull-up transistor 12 are both formed of the first gate line 48. Furthermore, the gate line of the second pull-down transistor 18 and the gate line of the second pull-up transistor 14 are both formed of the second gate line 60.

With respect to the structure, referring to FIGS. 2 and 5, the SRAM unit cell layout structure 44, as mentioned above, may further include the slot grounding electrode contact 78 disposed on the source 91 of the first pull-down transistor 16 and the source 91' of a first pull-down transistor of another adjacent SRAM unit cell structure. Furthermore, the grounding electrode pad 80 may be disposed on the slot grounding electrode contact 78. Alternatively, please refer to FIGS. 6 and 7, the pair of split grounding electrode contacts 82 and 84 may be included and disposed on the source 91 of the first pull-down transistor 16 and the source 91' of the first pull-down transistor of another adjacent SRAM unit cell structure, respectively. Furthermore, the grounding electrode pad 80 may be disposed on the pair of split grounding electrode contacts 82 and 84. Furthermore, as shown in FIGS. 5 and 7, the via 86 may be disposed on the grounding electrode pad 80. Furthermore, a metal-one interconnect 88 may be disposed on the via 86.

Herein, as conventionally referred, the dielectric layer between the metal-level one (metal-1, M1) and the metal-level two (metal-2, M2) above M1, or between two metal layers further thereabove, is referred to as "inter-metal dielectric (IMD)", which may further include, for example, IMD1, ILM2, IMD3, and the like. For example, M1 is located in IMD1; M2 is located in IMD2; and so on. And, the dielectric layer between the metal-level one (M1) and the substrate is referred to as "interlayer dielectric (ILD)", and the metal layer located in the interlayer dielectric is referred to as "metal-level zero (metal-0, M0)". Herein, the term "metal-zero interconnect" means a metal interconnect formed of M0 in the interlayer dielectric. Furthermore, in the present invention, a via may be further formed in the interlayer dielectric and may be referred to as via-level zero (via-0). Accordingly, the interlayer dielectric may be defined to have multi-sections. For example, referring to the cross-sectional views shown by FIGS. 4, 5, and 7, the interlayer dielectric-level one (ILD-1) 51 is approximately as high as the transistor gate, such as the gate lines 60, 48, 48', and 60' shown in FIG. 4; the metal-level zero, such as the metal-zero interconnects 64 and 64' and the grounding electrode pad 80 formed of the metal-level zero, is located in the interlayer dielectric-level two (ILD-2) 53; and via-0, such as the via 86, is located in the interlayer dielectric-level three (ILD-3) 83. M1, such as the metal-one interconnect 88 formed of M1, is on or above the interlayer dielectric-level three 83 and in IMD1.

According to still another embodiment, a method of fabricating an SRAM unit cell structure is also provided. The method includes steps as follows. First, a semiconductor substrate is provided. Next, a first inverter is formed at the semiconductor substrate. The first inverter includes a first pull-down transistor and a first pull-up transistor. A second inverter is formed at the semiconductor substrate. The second inverter includes a second pull-down transistor and a second pull-up transistor. The first inverter and the second inverter are within an interlayer dielectric-level one. A first slot contact and a second slot contact are formed in the interlayer dielectric-level one. The first slot contact electrically connects a drain of the first pull-down transistor and a drain of the first pull-up transistor. The second slot contact electrically connects a drain of the second pull-down transistor and a drain of the second pull-up transistor. An interlayer dielectric-level two is formed to cover the first inverter, the second inverter, and the interlayer dielectric-level one. Thereafter, a first microlithography and etch process is performed to form a first trench and a second trench in the interlayer dielectric-level two. The first trench exposes the first slot contact on the drain of the first pull-up transistor and a gate line of the second pull-up transistor. The second trench exposes the second slot contact on the drain of the second pull-up transistor and a gate line of the first pull-up transistor. Thereafter, the first trench and the second trench are filled with a metal-level zero to form a first metal-zero interconnect and a second metal-zero interconnect, respectively. The first metal-zero interconnect electrically connects the first slot contact and the gate line of the second pull-up transistor. The second metal-zero interconnect electrically connects the second slot contact and the gate line of the first pull-up transistor.

In detail, also referring to FIGS. 2-5, a method of fabricating an SRAM unit cell structure according to still another embodiment of the present invention is described as follows. First, the semiconductor substrate 46 is provided. Next, the first inverter 40 is formed at the semiconductor substrate 46.

The first inverter 40 includes the first pull-down transistor 16 and the first pull-up transistor 12. The second inverter 42 is formed at the semiconductor substrate 46. The second inverter 42 includes the second pull-down transistor 18 and the second pull-up transistor 14. The first inverter 40 and the second inverter 42 are within the interlayer dielectric-level one 51. Thereafter, the first slot contact 50 and the second slot contact 62 are formed in the interlayer dielectric-level one 51. The first slot contact 50 electrically connects the drain 90 of the first pull-down transistor 16 and the drain 92 of the first pull-up transistor 12. The second slot contact 62 electrically connects the drain 96 of the second pull-down transistor 18 and the drain 98 of the second pull-up transistor 14. An interlayer dielectric-level two 53 is formed to cover the first inverter 40, the second inverter 42, and the interlayer dielectric-level one 51.

Thereafter, a first microlithography and etch process is performed on the interlayer dielectric-level two 53 to form a first trench 55 and a second trench 57 in the interlayer dielectric-level zero. The first trench 55 exposes the first slot contact 50 on the drain 92 of the first pull-up transistor 12 and the second gate line 60 of the second pull-up transistor 14. The second trench 57 exposes the second slot contact 62 on the drain 98 of the second pull-down transistor 14 and the first gate line 48 of the first pull-up transistor 12. Thereafter, the first trench 55 and the second trench 57 are filled with a metal-level zero to form the first metal-zero interconnect 64 and the second metal-zero interconnect 66, respectively. The first metal-zero interconnect 64 electrically connects the first slot contact 50 and the second gate line 60 of the second pull-up transistor 14. The second metal-zero interconnect 66 electrically connects the second slot contact 62 and the first gate line 48 of the first pull-up transistor 12.

As mentioned above, the top surface of the first slot contact 50 may be allowed to be substantially as high as or slightly higher than the top surface of the second gate line 60 of the second pull-up transistor 14. Because a thin dielectric layer may be optionally formed after the formation of the gate line and before the formation of the trench for the slot contact, the resulted slot contact may have a top surface slightly higher than the top surface of the gate line. Likewise, the top surface of the second slot contact 62 may be allowed to be substantially as high as or slightly higher than the top surface of the first gate line 48 of the first pull-up transistor 12. Furthermore, the gate line of the first pull-down transistor 16 and the gate line of the first pull-up transistor 12 may be formed of a same gate line, such as the first gate line 48. Furthermore, the gate line of the second pull-down transistor 18 and the gate line of the second pull-up transistor 14 may be formed of a same gate line, such as the second gate line 60.

Furthermore, as shown in FIGS. 2 and 5, the following steps may be further included. The slot grounding electrode contact 78 in the interlayer dielectric-level one 51 may be formed on and electrically connecting the source 91 of the first pull-down transistor 16 and the source 91' of a first pull-down transistor of another adjacent SRAM unit cell structure simultaneously with forming the first slot contact 50. A second microlithography and etch process is performed on the interlayer dielectric-level two 53 to form a third trench 81 in the interlayer dielectric-level two 53 to expose the slot grounding electrode contact 78. The third trench 81 is further filled with the metal-level zero to form the grounding electrode pad 80 on the slot grounding electrode contact 78.

Alternatively, the shape of the grounding electrode contact may be a pair of split forms, as shown in FIGS. 6 and 7, and the following steps may be further included in this embodiment. The pair of split grounding electrode contacts 82 and 84 may be formed on the source 91 of the first pull-down transistor 16 and the source 91' of a first pull-down transistor of another adjacent SRAM unit cell structure in the interlayer dielectric-level one 51, simultaneously with forming the first slot contact 50. The second microlithography and etch process is performed on the interlayer dielectric-level two 53 to form the third trench 81 in the interlayer dielectric-level two 53. The third trench 81 exposes the split grounding electrode contacts 82 and 84. The third trench 81 is further filled with the metal-level zero to form the grounding electrode pad 80 across the interlayer dielectric-level one 51 and on the split grounding electrode contacts 82 and 84.

Furthermore, the method of fabricating an SRAM unit cell structure may further include the following steps. The interlayer dielectric-level three 83 may be formed to cover the first metal-zero interconnect 64, the second metal-zero interconnect 66 and the grounding electrode pad 80. The via 86 is formed on the grounding electrode pad 80 and passes through the interlayer dielectric-level three 83. The metal-one interconnect 88 may be formed on the via 86.

In the aforesaid method of fabricating an SRAM unit cell structure, each element may be formed by taking reference to or utilizing conventional materials or steps. For example, the gate line may include suitable electrically conductive material, such as polysilicon, metal silicide, or suitable metal material, such as aluminum or tungsten. If a metal gate line is utilized, it may include high-k dielectric material and work-function metal, such as titanium nitride (TiN) for pFET or titanium aluminide for nFET. The contact may include suitable electrically conductive material, such as tungsten or cupper. The metal-level zero or metal-level one may include suitable electrically conductive material, such as aluminum, cupper, or tungsten. For example, the metal-level zero may include tungsten, and the metal-level one may include copper; however, the present invention is not limited thereto.

Figure 8:
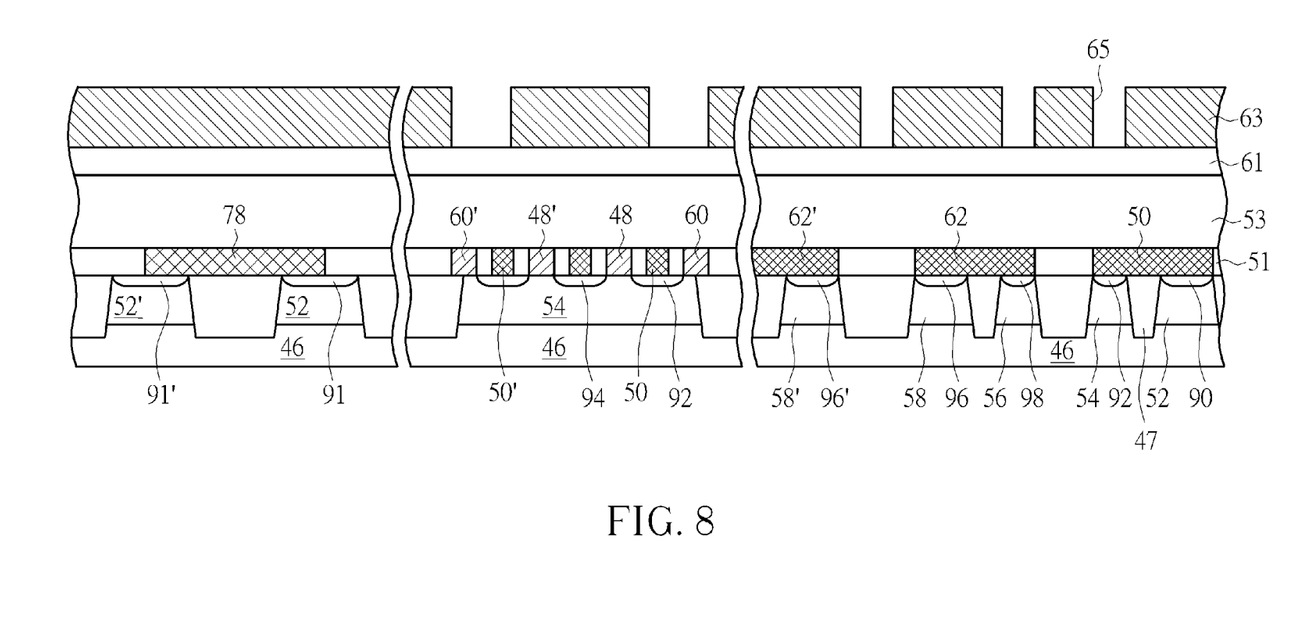
FIGS. 8 and 9 are schematic cross-sectional views illustrating a method of fabricating an SRAM unit cell structure according to an embodiment of the present invention.
Figure 9:
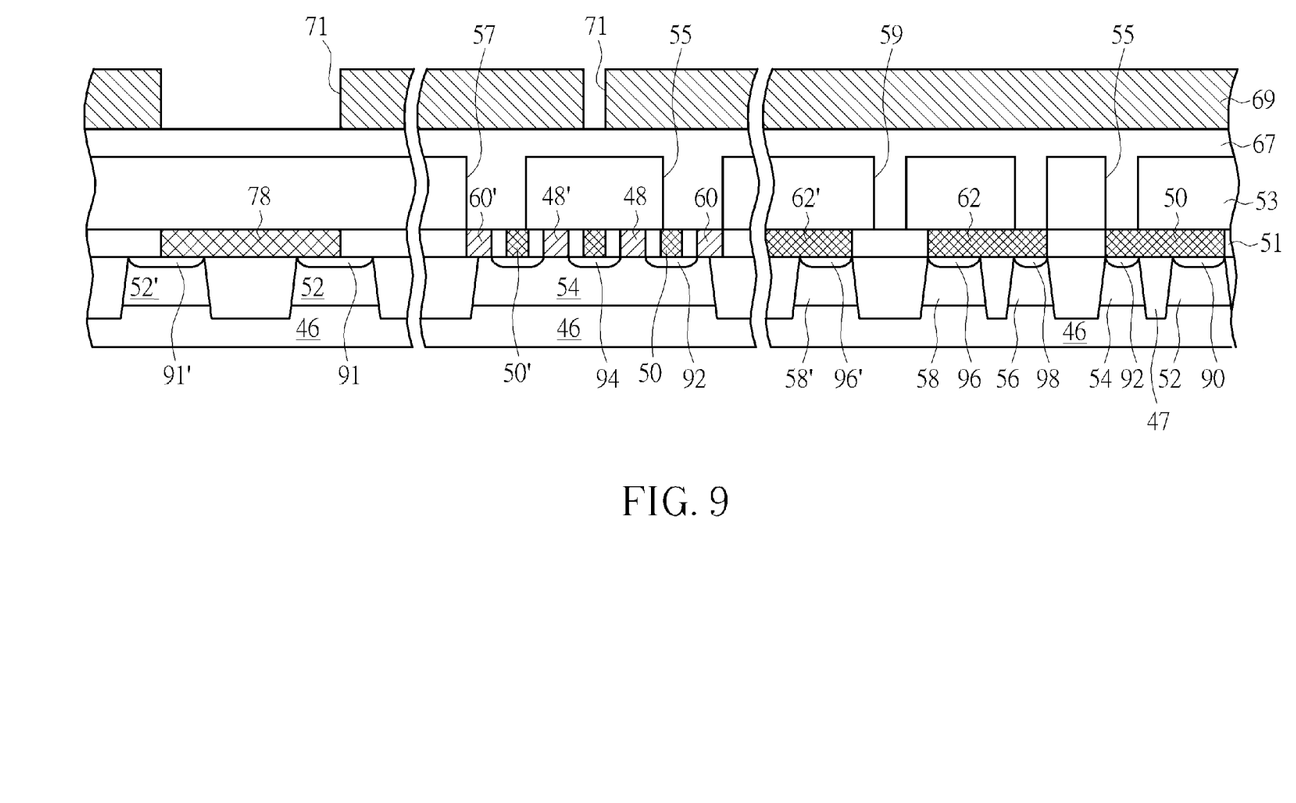

It is noticeable that the horizontal and vertical metal-zero interconnects (or pads) are formed through two respective microlithography and etch processes to form trenches, then to fill the trenches with metal material or electrically conductive material. For example, referring to FIG. 8, during that the first microlithography and etch process is performed, a hard mask 61 is formed on the interlayer dielectric-level two 53 and a patterned photo resist layer 63 having openings 65 is formed on the hard mask 61, the hard mask 61 is patterned through the patterned photo resist layer 63, then the patterned photo resist layer 63 is removed, the interlayer dielectric-level two 53 is etched through the patterned hard mask 61 to form the first trenches 55, the second trenches 57, and trenches 59 for forming for example word lines. When the second microlithography and etch process is performed as required for form vertical metal-zero interconnects (or pads), as shown in FIG. 9, a hard mask 67 may be formed to cover the trenches which have formed, and a patterned photo resist layer 69 having openings 71 and 73 is formed on the hard mask 67, the hard mask 67 is patterned through the patterned photo resist layer 69, then the patterned photo resist layer 69 is removed, the interlayer dielectric-level two 53 is etched through the patterned hard mask 67 to form the third trenches 81, and the trenches 85 for forming for example power electrode pad. The hard mask 67 is removed to expose each trench. The trenches are filled with the metal-level zero by for example conventional sputtering deposition, and a CMP process is performed to remove excess metal and for planarization, so as to obtain the horizontal and vertical metal-zero interconnects (or pads).

One of the features of the present invention is to use a slot contact which extends across the isolation structure to electrically connect a drain of the first pull-down transistor and a drain of the first pull-up transistor. Thus, just a horizontal metal-zero interconnect is required to be disposed on the slot contact to connect the slot contact and the gate line of the second pull-up transistor, without intersection or overlap of the horizontal and vertical metal-zero interconnects (or pads). Accordingly, when twice microlithography and etch processes are performed to form trenches for forming the horizontal and vertical metal-zero interconnects (or pads) respectively, no place of the substrate will be etched twice and the serious stitch recess can be avoided. Accordingly, junction leakage can be avoided. Furthermore, due to reduced density of the metal-zero interconnects, the loading effect is minimized. Furthermore, the process to form the metal-zero interconnects is relatively healthy and the yield can be increased. Reliability may be also enhanced due to little or no seams or voids formed by stitch recesses.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM) unit cell layout structure, comprising:
    a semiconductor substrate comprising a first active area and a second active area parallel to the first active area;
    a first gate line passing through a surface of the first active area and a surface of the second active area;
    a first slot contact disposed on the first active area and the second active area both on a same side of the first gate line;
    a third active area and a fourth active area both parallel to the second active area, the second active area positioned between the first active area and the third active area, the third active area positioned between the second active area and the fourth active area;
    a second gate line passing through a surface of the third active area and a surface of the fourth active area; and
    a second slot contact disposed on the third active area and the fourth active area both on a same side of the second gate line.

2. The SRAM unit cell layout structure according to claim 1, further comprising:
    a first metal-zero interconnect disposed on the first slot contact and the second gate line and extending from the first slot contact to the second gate line; and
    a second metal-zero interconnect disposed on the second slot contact and the first gate line and extending from the second slot contact to the first gate line.

3. The SRAM unit cell layout structure according to claim 2, wherein, the first slot contact and the second slot contact are disposed substantially along a straight line.

4. The SRAM unit cell layout structure according to claim 2, further comprising:
    a third gate line passing through a surface of the first active area on the side of the first gate line, the first slot contact located between the first gate line and the third gate line; and
    a fourth gate line passing through a surface of the fourth active area on the side of the second gate line, the second slot contact located between the second gate line and the fourth gate line.

5. The SRAM unit cell layout structure according to claim 4, further comprising:
    a word line pad connecting with the fourth gate line;
    a bit line contact connecting with the fourth active area on another side of the fourth gate line; and
    a bit line pad disposed on the bit line contact.

6. The SRAM unit cell layout structure according to claim 4, further comprising:
    a slot grounding electrode contact disposed on the first active area on another side of the first gate line and extending onto an active area of an adjacent SRAM unit cell layout structure; and
    a grounding electrode pad disposed on the slot grounding electrode contact.

7. The SRAM unit cell layout structure according to claim 6, further comprising:
    a via disposed on the grounding electrode pad; and
    a metal-one interconnect disposed on the via.

8. The SRAM unit cell layout structure according to claim 4, further comprising:
    a pair of split grounding electrode contacts disposed on the first active area on another side of the first gate line and an active area of an adjacent SRAM unit cell layout structure, respectively; and
    a grounding electrode pad disposed on the pair of split grounding electrode contacts.

9. The SRAM unit cell layout structure according to claim 8, further comprising:
    a via disposed on the grounding electrode pad; and
    a metal-one interconnect disposed on the via.

10. A static random access memory (SRAM) unit cell structure, comprising:
    a first inverter comprising a first pull-down transistor and a first pull-up transistor, wherein the first pull-down transistor is disposed on a first active area of a semiconductor substrate, the first pull-up transistor is disposed on a second active area of the semiconductor substrate, and the second active area is parallel to the first active area, wherein a first gate line of the first pull-down transistor and the first pull-up transistor passes through a surface of the first active area and a surface of the second active area;
    a second inverter comprising a second pull-down transistor and a second pull-up transistor, wherein the second pull-up transistor is disposed on a third active area of the semiconductor substrate, the second pull-up transistor is disposed on a fourth active area of the semiconductor substrate, and the third active area and the fourth active area are both parallel to the second active area, wherein the second active area is positioned between the first active area and the third active area, the third active area is positioned between the second active area and the fourth active area, and a second gate line of the second pull-down transistor and the second pull-up transistor passes through a surface of the third active area and a surface of the fourth active area;
    a first slot contact disposed on a drain of the first pull-down transistor and a drain of the first pull-up transistor, wherein the first slot contact is disposed on the first active area and the second active area both on a same side of the first gate line;
    a first metal-zero interconnect disposed on the first slot contact and the second gate line of the second pull-up transistor;
    a second slot contact disposed on a drain of the second pull-down transistor and a drain of the second pull-up transistor; and
    a second metal-zero interconnect disposed on the second slot contact and the first gate line of the first pull-up transistor, wherein the second slot contact is disposed on the third active area and the fourth active area both on a same side of the second gate line.

11. The SRAM unit cell structure according to claim 10, wherein, a top surface of the first slot contact is substantially as high as or higher than a top surface of the second gate line of the second pull-up transistor.

12. The SRAM unit cell structure according to claim 10, wherein, a top surface of the second slot contact is substantially as high as or higher than a top surface of the first gate line of the first pull-up transistor.

13. The SRAM unit cell structure according to claim 10, further comprising:
   a pair of split grounding electrode contacts disposed on a source of the first pull-down transistor and a source of a first pull-down transistor of another adjacent SRAM unit cell structure, respectively; and
   a grounding electrode pad disposed on the pair of split grounding electrode contacts.

14. The SRAM unit cell structure according to claim 13, further comprising a via disposed on the grounding electrode pad.

15. The SRAM unit cell structure according to claim 14, further comprising a metal-one interconnect disposed on the via.

16. The SRAM unit cell structure according to claim 10, further comprising:
   a slot grounding electrode contact disposed on a source of the first pull-down transistor and a source of a first pull-down transistor of another adjacent SRAM unit cell structure; and
   a grounding electrode pad disposed on the slot grounding electrode contact.

17. The SRAM unit cell structure according to claim 16, further comprising a via disposed on the grounding electrode pad.

18. The SRAM unit cell structure according to claim 17, further comprising a metal-one interconnect disposed on the via.

\* \* \* \* \*